US 6,969,425 B2

(12) United States Patent
Cabuz et al.

(10) Patent No.: US 6,969,425 B2
(45) Date of Patent: Nov. 29, 2005

(54) METHODS FOR REDUCING THE CURVATURE IN BORON-DOPED SILICON MICROMACHINED STRUCTURES

(75) Inventors: Cleopatra Cabuz, Edina, MN (US); Max C. Glenn, Shorewood, MN (US); Francis M. Erdmann, Maple Grove, MN (US); Robert D. Horning, Savage, MN (US)

(73) Assignee: Honeywell International Inc., Morristown, NJ (US)

( * ) Notice: Subject to any disclaimer, the term of this patent is extended or adjusted under 35 U.S.C. 154(b) by 126 days.

(21) Appl. No.: 10/346,887

(22) Filed: Jan. 17, 2003

(65) Prior Publication Data

US 2003/0129845 A1 Jul. 10, 2003

Related U.S. Application Data

(62) Division of application No. 09/634,932, filed on Aug. 8, 2000, now Pat. No. 6,544,655.

(51) Int. Cl.$^7$ ................................................ C30B 1/10
(52) U.S. Cl. ...................... 117/2; 117/3; 117/7; 117/9; 117/931
(58) Field of Search ................ 117/2, 3, 7, 9, 117/931

(56) References Cited

U.S. PATENT DOCUMENTS

| | | | | |
|---|---|---|---|---|
| 3,922,705 | A | * | 11/1975 | Yerman .......................... 338/4 |
| 4,249,970 | A | * | 2/1981 | Briska et al. ................ 438/563 |
| 4,543,457 | A | | 9/1985 | Petersen et al. |
| 5,731,626 | A | | 3/1998 | Eaglesham et al. |
| 6,177,323 | B1 | | 1/2001 | Wu |

FOREIGN PATENT DOCUMENTS

| | | | |
|---|---|---|---|
| EP | 0008642 | * | 7/1979 |
| GB | 2259311 A | | 3/1993 |
| JP | 405299348 | | 11/1993 |
| WO | WO 85/03383 | | 8/1985 |

OTHER PUBLICATIONS

C. Cabuz et al. "Microphysical Investigations on Mechanical Structures Realized in P+ Silicon", Journal of Microelectromechanical Systems, vol. 4, No. 3, Sep. 1995, pp. 109–118.
J. T. Borenstein et al., "Characterization of Membrane Curvature in Micromachined Silicon Accelerometers and Gyroscopes Using Optical Interferometry", SPIE, vol. 2879, pp. 116–125.
"TMAH/IPA Anisotropic Etching Characteristics", Sensors and Actuators A, 37–38, 1993, pp. 737–743.
M. Shikida et al., "Comparison of Anisotropic Etching Properties Between KOH and TMAH Solutions", Dept. of Micro System Engineering, Nagoya University, Chikusa, Nagoya, 464–8603, Japan, dated prior to Aug. 8, 2000, 6 pages.
C. Cabuz, "Tradeoffs in MEMS Materials", SPIE, vol. 2881, 1996, pp. 160–170.
Yogesh B. Gianchandani et al., "A Bulk Silicon Dissolved Wafer Process for Microelectromechanical Devices", Journal of Microelectromechanical Systems, vol. 1, No. 2, Jun. 1992, pp. 77–85.

* cited by examiner

Primary Examiner—Robert Kunemund
(74) Attorney, Agent, or Firm—Kris T. Fredrick

(57) ABSTRACT

Layers of boron-doped silicon having reduced out-of-plane curvature are disclosed. The layers have substantially equal concentrations of boron near the top and bottom surfaces. Since the opposing concentrations are substantially equal, the compressive stresses on the layers are substantially balanced, thereby resulting in layers with reduced out-of-plane curvature.

30 Claims, 12 Drawing Sheets

METHODS FOR REDUCING THE CURVATURE IN BORON-DOPED SILICON MICROMACHINED STRUCTURES

CROSS REFERENCE TO RELATED APPLICATION

This application is a divisional of U.S. patent application Ser. No. 09/634,932, filed Aug. 8, 2000 now U.S. Pat. No. 6,544,655.

This Application is also related to co-pending U.S. patent application Ser. No. 10/334,588, filed Dec. 30, 2002, entitled "METHODS FOR REDUCING THE CURVATURE IN BORON-DOPED SILICON MICROMACHINED STRUCTURES.

FIELD OF THE INVENTION

The present invention is related generally to semiconductor manufacturing and Micro Electro Mechanical Systems (MEMS). More specifically, the invention relates to methods for reducing the curvature of a boron-doped silicon layer.

BACKGROUND OF THE INVENTION

Micro Electro Mechanical Systems (MEMS) often utilize micromachined structures such as beams, slabs, combs, and fingers. These structures can exhibit curvature due to internal stresses and doping gradients. The curvature can be a significant source of error in inertial sensors such as accelerometers and gyroscopes. Many desired structures have a flatness design criteria that is difficult or impossible to achieve using current processes. In particular, silicon layers heavily doped with boron can have a significant curvature when used in suspended structures.

The aforementioned structures are often made starting with a silicon wafer substrate. A boron-doped silicon epitaxial layer is then grown on the silicon wafer substrate and is subsequently patterned in the desired shape. As is further described below, the boron is used as an etch stop in later processing to allow the easy removal of the silicon substrate, leaving only the thin boron-doped epitaxial layer.

At the interface between the boron-doped epitaxial layer and the silicon substrate, the boron tends to diffuse out of the epitaxial layer and into the silicon substrate. This depletes the epitaxial layer of some boron, and enriches the silicon substrate with boron. The epitaxial layer thus often has a reduced concentration of boron near the interface, which is sometimes called the "boron tail."

After the boron-doped silicon epitaxial layer has been grown to the desired thickness, or at some later point of processing, the silicon substrate is removed often using an etchant that is boron selective. Specifically, the etchant will etch away the silicon substrate, but not the boron-doped silicon epitaxial layer. One such etchant is a solution of ethylene diamine, pyrocatechol, and water (EDP). The etchant typically etches the silicon at a fast rate up to a certain high level boron concentration, at which point the etch rate significantly slows. This high boron concentration level is termed the etch stop level.

The boron concentration near the epitaxial layer surface having the boron tail may be lower than the etch stop level, allowing the etching to remove some of the epitaxial layer surface at a reasonable rate, stopping at the etch stop level of boron concentration beneath the initial surface. The resulting boron-doped structure, such as a beam, thus has two surfaces, the silicon side surface that has the boron tail and the air side surface that has a boron surface layer concentration substantially equal to the concentration in the bulk of the beam away from either surface. Thus, the opposing surfaces have different boron surface layer concentrations.

Boron occupies substitutional lattice sites in silicon, the boron having a Pauling's covalent radius roughly 25% smaller than that of silicon. The size difference causes the boron-doped layers to shrink relative to the undoped or lower doped layers. This size difference leads to an initial tensile stress, with higher boron concentrations leading to higher tensile stresses and lower boron concentrations leading to lower tensile stresses. After release from the substrate, the lower boron concentrations in the tail results in a relatively lower tensile stress than the tensile stress in the air side layer having a higher boron concentration. The tensile stress can transition to a compressive stress after further process steps, such as oxidation and annealing at high temperatures. Regardless of the exact mechanism, an unequal surface layer boron concentration in silicon can lead to an unequal application of stress by those layers in the structure which can lead to the cupping or out-of-plane bending and curvature of a structure where flatness is desired.

What would be desirable, therefore, is a process for reducing the unequal surface layer concentrations of boron in boron-doped silicon to produce substantially flat or planar boron-doped silicon microstructures.

SUMMARY OF THE INVENTION

The present invention provides methods for forming relatively planar boron-doped silicon layers having reduced out-of-plane curvature by providing substantially balanced doping profiles of boron near each of the layer surfaces. A boron-doped silicon epitaxial layer is first grown on a silicon substrate, causing the boron near the silicon substrate to diffuse out of the epitaxial layer into the silicon substrate. As in the prior art, this depletes the boron concentration near the interface between the epitaxial layer and the silicon substrate. However, and in a first illustrative embodiment of the present invention, a second epitaxial layer is grown on the first boron-doped silicon epitaxial layer. The second epitaxial layer preferably has a boron concentration that is less than the boron concentration in the first grown epitaxial layer. Thus, boron in the first boron-doped epitaxial layer tends to diffuse into both the silicon substrate and the second epitaxial layer. This creates substantially similar "boron tails" at both surfaces of the first epitaxial layer. A boron selective etch can be used to remove both the silicon substrate and the second epitaxial layer. Since the remaining first epitaxial layer has substantially similar "boron tails" at both top and bottom surfaces, the compressive stresses are substantially balanced leaving a relatively planar layer.

It is contemplated that any suitable material can be used to deplete the boron concentration near the top surface of the first boron-doped epitaxial layer. For example, rather than growing a silicon based second epitaxial layer, it is contemplated that an oxide layer may be used. Preferably, the oxide layer is selected such that the boron segregated into the oxide layer, depleting the surface silicon layer of boron. One suitable oxide layer is silicon oxide that can be formed through the oxidation of the silicon in the expitaxial layer.

Rather than growing a boron-doped first epitaxial layer on the silicon substrate, it is contemplated that the top surface of a silicon wafer may be directly doped with boron by, for example, diffusion, ion implantation, or any other suitable method. Then, the second epitaxial layer may be grown directly on the top surface of the silicon wafer. As described above, the boron may tend to diffuse both into the substrate and into the second epitaxial layer, leaving substantially similar "boron tails" on both sides of the heavily doped silicon layer. A boron selective etch can then be used to remove both the low-boron-doped silicon substrate and the second epitaxial layer.

Instead of forming substantially similar "boron tails" on either side of a heavily boron-doped layer to reduce the curvature of the layer, the present invention also contemplates providing a layer with a boron tail near one surface, and then substantially removing the boron tail. In this embodiment, a first boron-doped silicon epitaxial layer may be grown on a silicon substrate. Alternatively, and as indicated above, boron may be provided directly in the top surface of the silicon substrate. In either case, the boron tends to diffuse into the silicon substrate, thereby creating a boron tail. The silicon substrate can be etched using a first etchant for a first period of time, such that the silicon substrate and at least part of the boron tail are removed at a first etch rate. The silicon substrate can then be further etched using a second etchant for a second period of time, such that more of the boron tail is removed at a second etch rate. The second etchant can be the same as the first etchant or a different etchant that is less inhibited by boron.

In a related method, it is contemplated that the second etchant may be non-boron selective etchant, such as a dry etch (RIE). In this embodiment, the first etchant, which is boron selective, can be used to remove the silicon substrate and at least part of the boron tail up the etch stop level. The non-boron selective etchant is then used to remove the remaining boron tail, or any portion thereof. The non-boron selective etch may also etch away some of the material from the opposite side surface of the heavily boron-doped layer.

Another method contemplates providing a relatively planar wafer having a heavily boron-doped layer thereon. In this illustrative embodiment, a first heavily boron-doped epitaxial layer is grown on a top surface of a silicon wafer, followed by a second non-doped (or lightly doped) epitaxial layer. Because of the tensile stress in the boron doped layer, the wafer will show a significant curvature (cupping). In order to reduce wafer curvature so that it is compatible with further processes, another heavily doped epitaxial layer is grown on the top surface of the wafer. In many cases, during the epitaxial growth of the boron doped, silicon epitaxial layer from the bottom side of the wafer, a thin boron doped layer is grown on the front side of the wafer as well. A dry etch (non-boron selective etch) is then used to remove the heavily doped epitaxial layer on the top surface of the structure, and possibly part of the non-doped (or lightly doped) epitaxial layer thereunder. A boron selective etch is then used to remove the remaining portion of the non-doped (or lightly doped) layer on the top surface of the structure. This may produce a relatively planar wafer because heavily boron-doped layers remain on both the top and bottom surfaces of the wafer. It has also been found that the top surface of the top heavily boron-doped layer has very few defects with little contamination, thereby providing an ideal layer for forming the desired micromachined structures such as beams, slabs, combs, and fingers.

DETAILED DESCRIPTION OF THE INVENTION

The formation of layers used to create structures such as MEMS microstructures often includes the growth of a boron-doped silicon epitaxial layer upon a single crystal silicon substrate. The boron is used as an etch stop in later processing to allow the easy removal of the silicon substrate, leaving only the thin boron-doped epitaxial layer to obtain the final resulting microstructure. The boron-doped epitaxial layer typically has an "air side" and a "silicon substrate side." The concentration of boron can remain relatively constant from the center of the layer to the air side surface. At the silicon substrate side, however, the boron concentration drops off, as some of the boron diffuses out of the boron-doped silicon epitaxial layer and into the silicon substrate layer. This drop off in boron concentration is known as the "boron tail."

Figure 1:
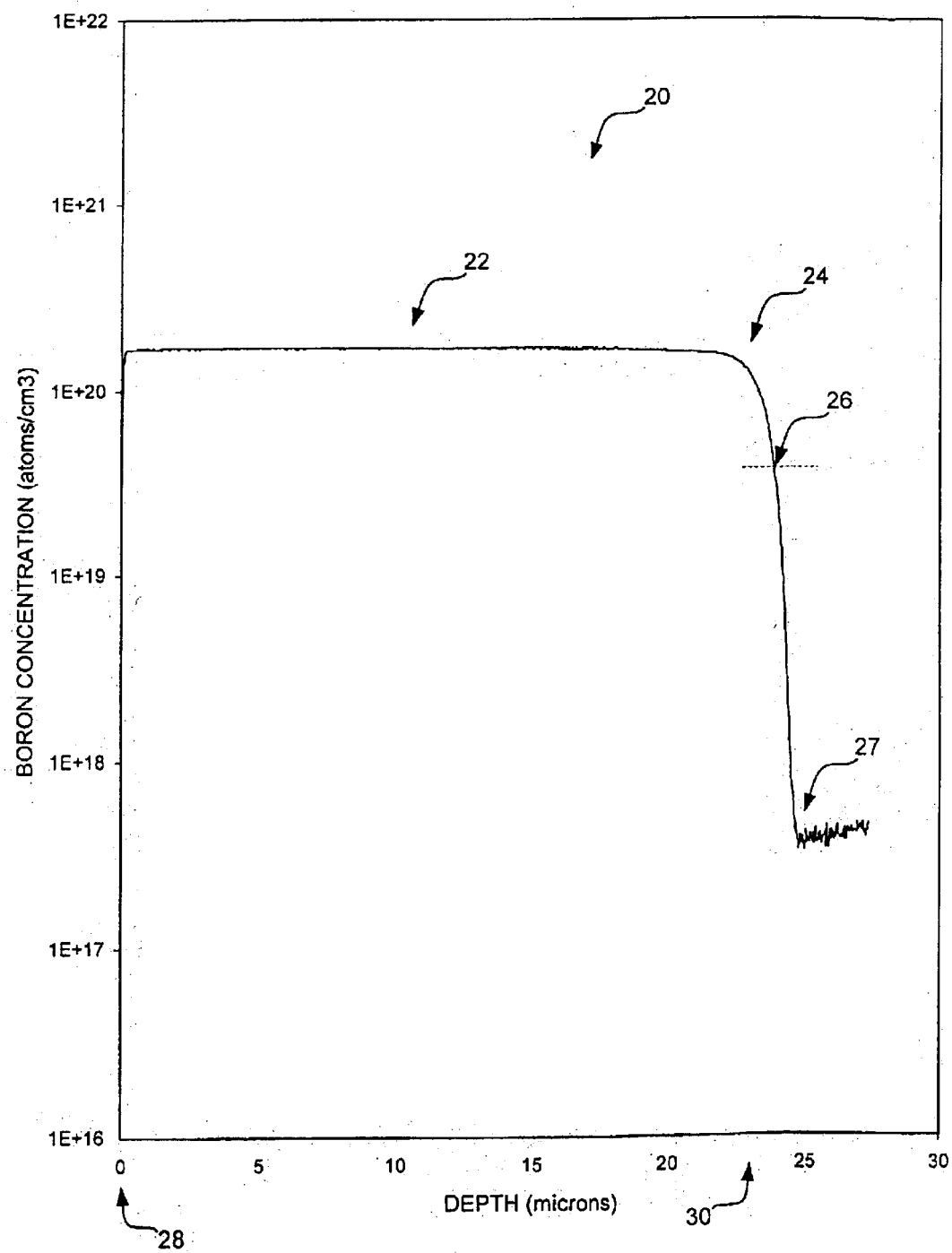
FIG. 1 is a graph of boron atom concentration versus depth into a boron-doped silicon layer, showing the boron tail having decreasing boron atom concentration toward the silicon substrate side.

FIG. 1 is a graph 20 of boron atom concentration versus depth into a boron-doped silicon epitaxial layer, showing the boron tail having decreased boron atom concentration toward the silicon substrate side. The X axis corresponds to the depth of the layer, from the air side surface, indicated at 28, to the silicon substrate side surface, indicated at 30. The plot includes a constant boron concentration region at 22, a shoulder region at 24, dropping to an etch stop level indicated at 26, and dropping further below the etch stop level as indicated in region 27. In one method, a constant boron concentration of about $1.5 \times 10^{20}$ boron atoms per cubic centimeter is provided in the constant boron concentration region.

When using a boron selective etch such as EDP, the silicon substrate surface will be etched away, as well as region 27, but with the etch stopping near etch-stop level 26, leaving the remainder of the epitaxial layer substantially intact, and forming a boron-doped silicon layer. Etching may not stop completely at the etch stop level, but may slow considerably. With some etchants, an etch stop level occurs at about 7 to $9 \times 10^{19}$ boron atoms per cubic centimeter. At this level and above, the etching rate drops one to two orders of magnitude for some etchants such as EDP.

A first method for reducing the curvature of a boron-doped structure includes encapsulating the air side of the epitaxial layer in a second epitaxial boron-doped silicon layer having a significantly lower boron concentration than the first epitaxial layer. After the growth of the first boron-doped epitaxial layer to the desired thickness, the growth process can be continued with the growth of a layer of silicon having a low or no concentration of boron. The concentration of boron is preferably at least one order of magnitude lower than the etch stop level for the etchant to be used. In one embodiment, the second epitaxial layer is very thin, between about 2 and 10 microns.

After the desired thickness of the second epitaxial layer has been achieved, the growth can be stopped. In one embodiment, the wafer is kept at the same temperature for a period of time about equal to the growth time of the first epitaxial layer. A second boron tail can thus be formed toward the second epitaxial layer. The wafer can be etched in an etchant such that the lower boron concentration silicon layers on both sides of the first epitaxial layer are removed. In one embodiment, EDP is used as the etchant, and the etching stops at a boron concentration of about $9 \times 10^{19}$ cm$^{-3}$, leaving the air side of the wafer having a boron tail similar to the boron tail in the silicon substrate side. If desired, the resulting wafer may be polished to remove the surface roughness which can be associated with the dislocation lines formed in silicon as a result of the high stress induced by the boron doping.

Figure 2A:
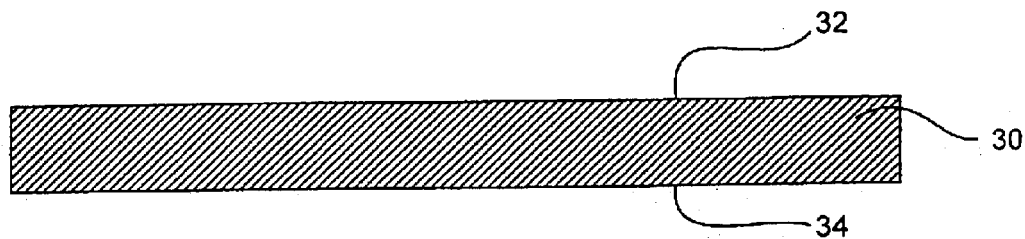
FIGS. 2A–2D are schematic representations of a method for creating a relatively planar boron-doped silicon epitaxial layer having a boron tail near both top and bottom surfaces, the method including the growth of a second, lower boron-doped silicon epitaxial layer over a first boron-doped silicon epitaxial layer.
Figure 2B:
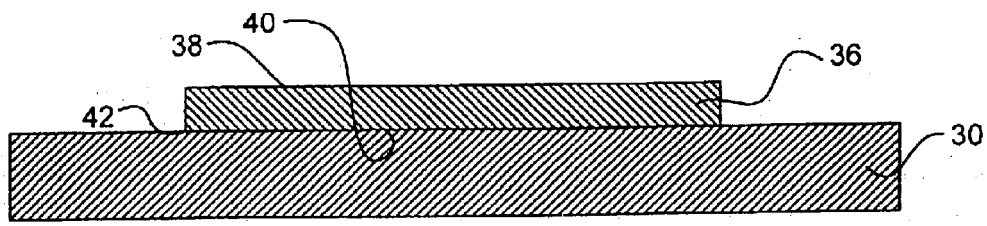

FIGS. 2A–2D include schematic representations of a first method for creating a boron-doped silicon epitaxial layer having a boron tail near both surfaces, the method including the growth of a second, lower concentration boron-doped silicon epitaxial layer over the first, higher concentration boron-doped silicon epitaxial layer. Beginning with FIG. 2A, a silicon wafer 30 is provided as a substrate, which is later removed through etching. Silicon wafer 30 has a first surface 32 and a second surface 34. A first epitaxial layer 36 of boron-doped silicon is grown on silicon wafer 30 on first surface 32, as illustrated in FIG. 2B. The growth of first epitaxial layer 36 forms an interface 42 between first epitaxial layer 36 and silicon wafer 30. Boron tends to diffuse out of first epitaxial layer 36 near interface 42, from first epitaxial layer 36 into silicon wafer 30. First epitaxial layer 36 extends between a silicon side surface 40 and an air side surface 38.

Figure 2C:
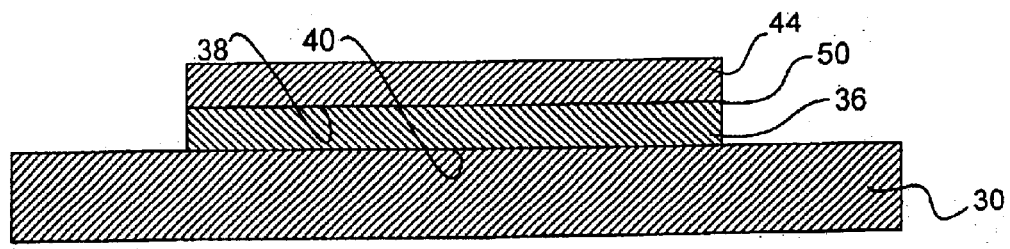

FIG. 2C illustrates another step in the process involving the growth of a second boron-doped silicon epitaxial layer 44 on first boron-doped epitaxial layer 36. Second epitaxial layer 44 has a lower (or no) concentration of boron than first epitaxial layer 36 and forms a second interface 50 between the two epitaxial layers. Due to the lower concentration of boron in the second epitaxial layer, boron tends to diffuse from the first epitaxial layer 36 into the second epitaxial layer 44. The out diffusion of boron from first epitaxial layer 36 creates a second boron tail near the air side 38. This second boron tail is preferably similar to the boron tail formed near silicon side 40, ultimately creating similar surface regions of stress gradient relative to the bulk of the epitaxial layer, at both surfaces of the first epitaxial layer 36.

Figure 2D:
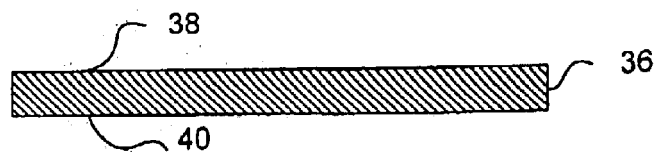

FIG. 2D illustrates first epitaxial layer 36 after etching with a boron selective etchant, for example, EDP. Both silicon wafer 30 and second epitaxial layer 44 are removed, leaving the first epitaxial layer 36 with surface regions of reduced boron concentration at both silicon side 40 and air side 38.

Figure 3A:
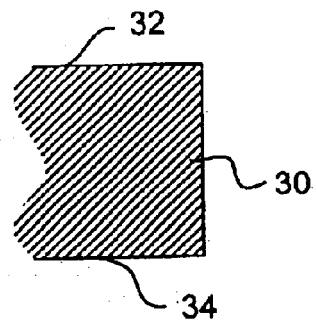
FIGS. 3A–3D are schematic representations of the method of FIGS. 2A–2D, in greater detail.
Figure 3B:
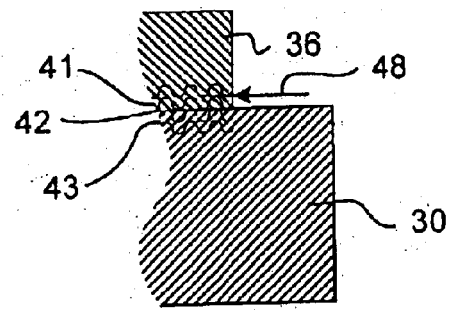

Referring now to FIGS. 3A through 3D, the first method discussed, with respect to FIGS. 2A through 2D, is illustrated in greater detail. FIGS. 3A through 3D correspond to FIGS. 2A through 2D, respectively, and include many of the same reference numerals which need not be identified. FIG. 3B illustrates the formation of interface 42 between silicon wafer 30 and first epitaxial layer 36, indicated by wavy cross hatching, including a boron depleted region 41 in first epitaxial layer 36 and a boron enriched layer 43 in silicon substrate 30. Arrow 48 indicates the physical location that will correspond to the etch stop position in first epitaxial layer 36.

Figure 3C:
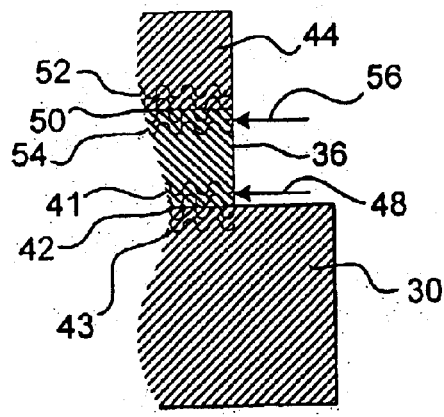

FIG. 3C illustrates the formation of second interface region 50 between second epitaxial layer 44 and first epitaxial layer 36, including a boron depleted region 54 and a boron enriched region 52, formed by the out diffusion of boron from the first epitaxial layer 36 to the second lower boron concentration epitaxial layer 44. Arrow 56 indicates the physical location that will correspond to the etch stop position on the surface of first epitaxial layer 36 near interface 50.

Figure 3D:
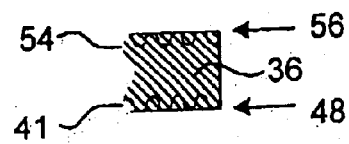

FIG. 3D illustrates first boron-doped epitaxial layer 36 after etching, resulting in the loss of silicon wafer 30 and second epitaxial layer 44. Etching also results in the partial loss of the first epitaxial layer up to the etch stop positions, indicated by arrows 48 and 56. As can be seen in FIG. 3D, first epitaxial layer 36 has a boron tail near both surfaces, at 41 and 54. The boron tail regions preferably have similar boron concentration profiles and similar contributions of tensile stress applied to each surface, acting to counterbalance the effect of the opposing tensile stress.

Figure 4:
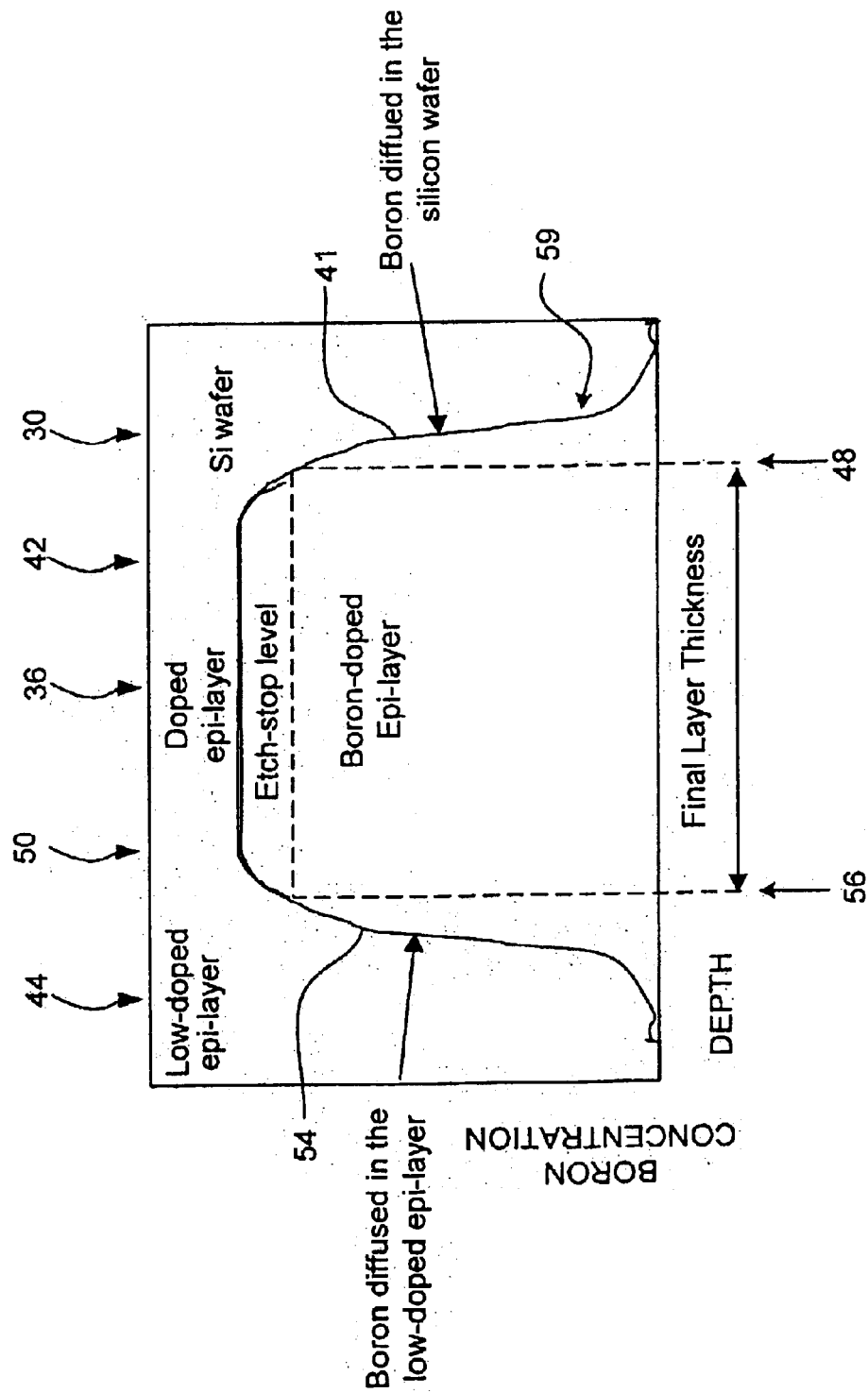
FIG. 4 is a transverse cross-sectional view of the three layers of FIG. 3C illustrating the boron tail near both top and bottom surfaces of the boron-doped epitaxial layer.
Figure 5:
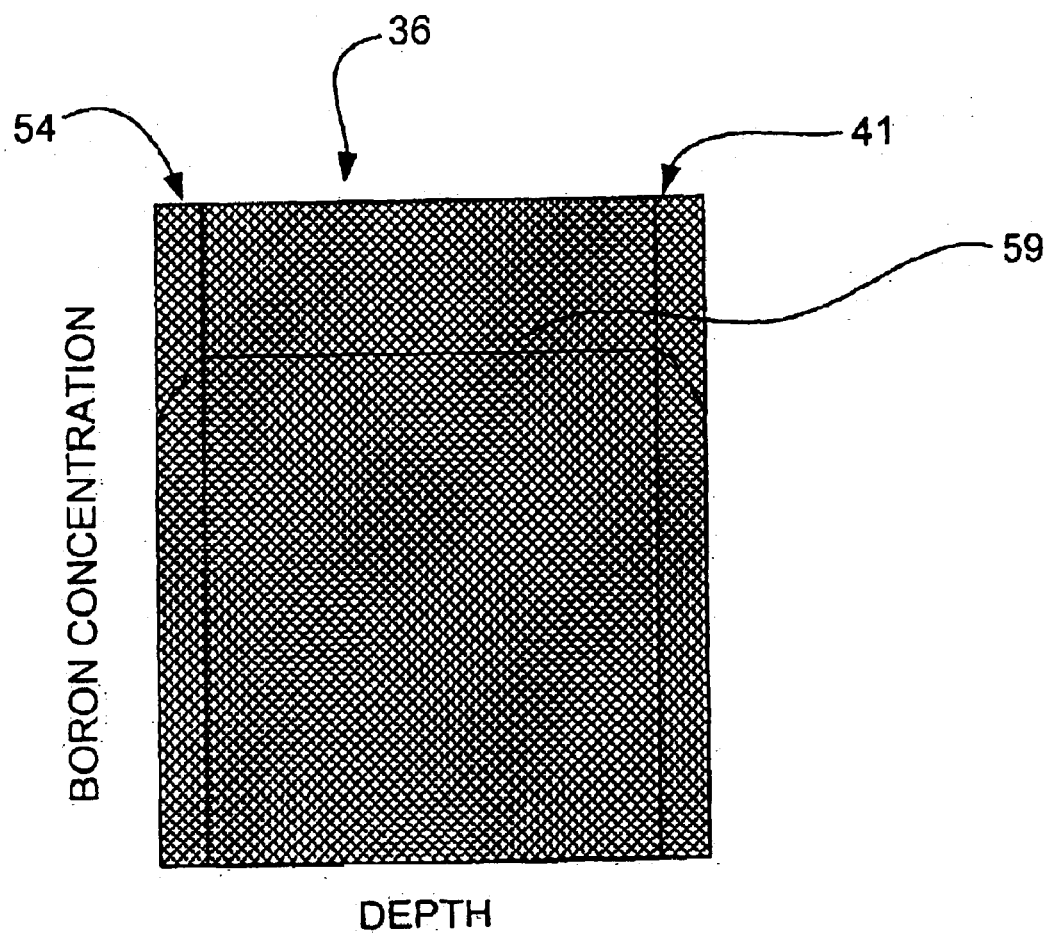
FIG. 5 is a transverse cross-sectional view of the boron-doped epitaxial layer of FIG. 3D illustrating the boron tail near both top and bottom surfaces of the boron-doped epitaxial layer.

FIG. 4 is a transverse cross-sectional view of the three layers of FIG. 3C, illustrating the boron tail near both surfaces of the boron-doped epitaxial layer. A plot of boron concentration 59 is superimposed on the cross-sectional view. The composite layers include silicon wafer 30 adjacent to first epitaxial layer 36 which is adjacent to second epitaxial layer 44. First boron tail 41 may be seen near silicon layer 30, and second boron tail 54 may be seen near second epitaxial layer 44. The boron selective etchant thus etches into first epitaxial layer 36 to the etch stop locations on each surface of the layer. FIG. 5 is a transverse cross-sectional view of the boron-doped epitaxial layer 36 of FIG. 3D after etching, illustrating the boron tails 41 and 54 near both surfaces of the boron-doped epitaxial layer.

Another method according to the present invention includes etching the boron tail for an extended period to reduce or eliminate the boron tail. At a boron concentration of about 7 to $9 \times 10^{19}$ cm$^{-3}$, the etch rate of the boron-doped silicon layers in several etching solutions, such as EDP (EPW), potassium hydroxide (KOH), and tetramethyl ammonium hydroxide (TMAH), decreases to varying degrees. For example, while EDP declines two orders of magnitude, the etch rate of TMAH declines by about a factor of five (5). Illustrative times for etching away the boron tail in different etchants are listed in Table 1 below.

TABLE 1

|  | EDP @ 90 C. | KOH 24% @ 60 C. | TMAH 25% @ 70 C. |
|---|---|---|---|
| Non-doped silicon | 0.5 micron/min | 0.5 micron/min | 0.15 micron/min |
| Boron-doped silicon, $7 \times 10^{19}$ cm$^{-3}$ | 0.015 micron/min | 0.05 micron/min | N/A |
| Boron-doped silicon, $10 \times 20$ cm$^{-3}$ | 0.002 micron/min | 0.03 micron/min | 0.027 micron/min |
| Time to remove the boron tail | 70 to 500 min | 33 min | 37 min |

By using such an extended etch in EDP, KOH, or TMAH, the boron tail can be reduced, which reduces the curvature of the boron-doped structures. In this method, the epitaxial layer can be etched in EDP or another etching solution having high boron selectivity, up to the etch stop limit. The sample can be kept in the same etching solution for a longer period of time, such as between about 30 minutes and several hours. This etch can be continued until the curvature is brought inside acceptable limits. Alternatively, the sample may be moved into a second etching solution having a lower selectivity to boron doping, for example TMAH, for a second time period, such as about 30 minutes. This second etch can remove the silicon layer including the boron tail. It is contemplated that the curvature of the wafer can be measured at selected intervals of time and the process adjusted accordingly.

Figure 6A:
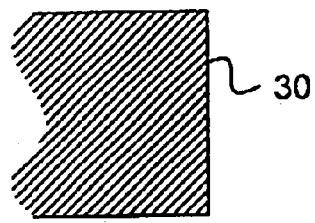
FIGS. 6A–6D are schematic representations of a method for creating a relatively planar boron-doped silicon epitaxial layer having a reduced or eliminated boron tail, the method including increased etching of the boron-doped silicon epitaxial layer in the region of the boron tail.
Figure 6B:
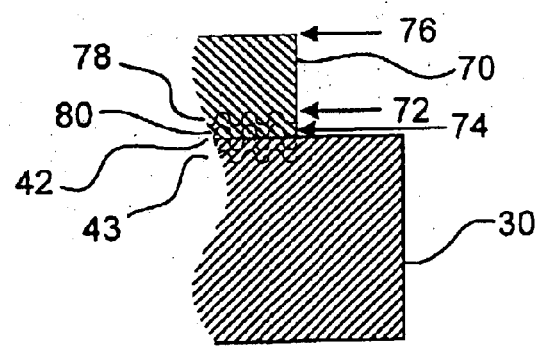

FIGS. 6A–6D illustrate a second method for creating a boron-doped silicon epitaxial layer having a reduced or eliminated boron tail, the method including increased etching of the boron-doped silicon epitaxial layer, including the boron tail. The second method illustration requires no figures similar to FIGS. 2A through 2D, which are omitted, but may be inferred. FIGS. 6A through 6D are similar in format to FIGS. 3A through 3D, showing only a portion of each layer. FIG. 6A illustrates silicon substrate layer 30, and FIG. 6B illustrates the silicon substrate layer after the growth of epitaxial layer 70, defining interface 42 therebetween. A boron depleted tail region may be seen near interface 42 including an inner tail region 78 and an outer tail region 80, where inner tail region 78 has a boron concentration less than the bulk of the epitaxial layer, but greater than the outer tail region 80. The boron has diffused into the boron enriched region 43 in silicon substrate layer 30, as previously described. The final dimensions of epitaxial layer 70 are indicated by arrows. The limit of the first etch is indicated at 74, the limit of the second etch is indicated at 72, and the final dimension of the air side surface of the epitaxial layer is indicated at 76.

Figure 6C:
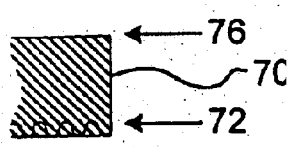

FIG. 6C illustrates the result of a first etching step using a boron selective etchant. This first etching step is carried out under normal conditions in one embodiment. The first etching step results in the etching away of the silicon substrate and the epitaxial layer up to the first etch stop point where the boron concentration increases to a level where the rate of etching significantly slows, often one or two orders of magnitude below the rate at the outer surface. Thus, the first etching step etches away part of epitaxial layer 70 to the point indicated at 72, partially through the boron tail.

After the first etching step, a second etching step may be performed. In one embodiment, the second etching step is a continuation of the first etching step, with the second etching step being carried out for a longer than normal period. In one embodiment, the first etching step is performed at a temperature of about 115 degrees Centigrade in a solvent such as EDP for a period of about 500 minutes to remove the silicon wafer 30, which in one embodiment can have a thickness of about 500 microns. The second etching step may then be performed at a temperature of about 115 degrees Centigrade in a solvent such as EDP for a period of about 90 minutes. The second time period could be longer, to carry out the etching of the higher boron concentration regions of the boron tail, due to the decreased etching rate at that higher boron concentrations.

Figure 6D:

In another embodiment, the second etching step is performed in an etchant different from the first etchant, such as KOH or TMAH. The second etching step can be continued until the boron tail is even further etched away, reducing the degree of curvature of the epitaxial layer. FIG. 6D illustrates epitaxial layer 70 after the second etching step, having a greatly reduced boron tail at the silicon side of the layer.

Figure 7:
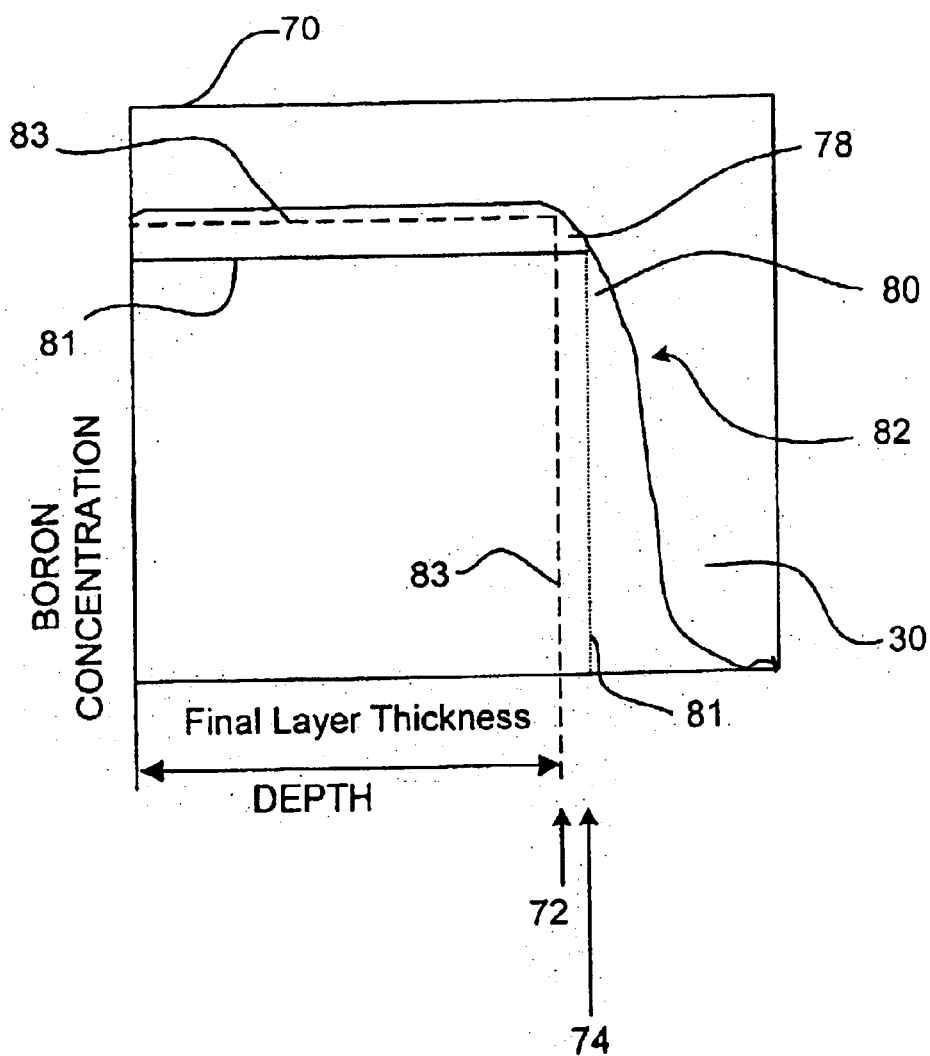
FIG. 7 is a transverse cross-sectional view of the two layers of FIG. 6B, illustrating the boron tail near the silicon substrate side surface of the boron-doped epitaxial layer, as well as the initial etch-stop level and the extended etch-stop level.

FIG. 7 is a transverse cross-sectional view of the two layers of FIG. 6B illustrating the boron tail near the silicon substrate side surface of the boron-doped epitaxial layer, as well as the initial etch-stop level 81 and the extended etch-stop level 83. A plot 82 of boron concentration is superimposed upon the epitaxial layer, with the extent of the first etch indicated at 74 and the extent of the second, or extended etch indicated at 72. As can be seen from inspection of FIG. 7, the first etching step etches away an outermost layer of epitaxial layer 70, and the second etching step further etches away an outermost layer of the epitaxial layer. In one embodiment, the second etch step does not completely remove the boron tail, but significantly reduces the thickness, thereby significantly reducing the gradient stress contributed by the boron tail. In some embodiments, in particular, embodiments utilizing less boron selective etchants, some of the opposing air side of the epitaxial layer is also somewhat removed.

FIGS. 8A–8D illustrate yet another method for creating a boron-doped silicon epitaxial layer having a boron tail near both top and bottom surfaces. The method including the growth of an oxide layer over the boron-doped silicon epitaxial layer, rather than a silicon epitaxial layer as shown in FIGS. 3A through 3D. This method is similar to the method described with reference to FIGS. 3A through 3D in that both include forming a second layer over the boron-doped silicon layer for the purpose of drawing out some boron from the epitaxial layer by diffusion into the second layer. The out diffusion of boron causes the formation of a second boron tail on the second surface of the epitaxial layer to counteract the effects of the first boron tail caused by the diffusion of boron out of the epitaxial layer and into the silicon layer.

When forming the oxide layer, the boron tends to segregate into the oxide layer. While the boron is segregating into the oxide layer, boron will likely continue to diffuse into the silicon layer. Thus, it is often beneficial to have the segregation coefficient of boron in the oxide layer be higher than the diffusion rate of the boron in the silicon substrate layer.

Attempting to achieve a pair of relatively balanced boron tails may thus benefit from a selection of materials, thicknesses, times and temperatures in forming the oxide layer. In one embodiment, a silicon oxide layer of about 0.5 microns thick of wet oxide is grown at about 1000 degrees Centigrade.

Figure 8A:
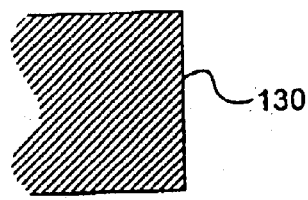
FIGS. 8A–8D are schematic representations of a method for creating a boron-doped silicon epitaxial layer having a boron tail near both top and bottom surfaces, the method including the growth of an oxide layer over the boron-doped silicon epitaxial layer.
Figure 8B:
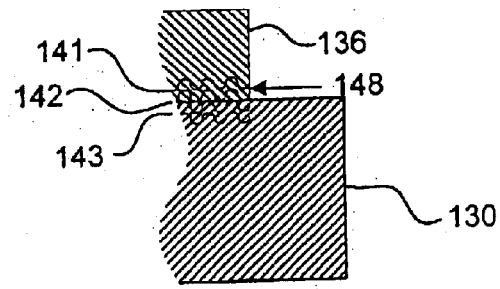

FIG. 8B illustrates the formation of interface 142 between silicon wafer 130 and first epitaxial layer 136, indicated by wavy cross hatching, including a boron depleted region 141 in first epitaxial layer 136 and a boron enriched layer 143 in silicon substrate 130. Arrow 148 indicates the physical location that will correspond to the etch stop position in first epitaxial layer 136.

Figure 8C:
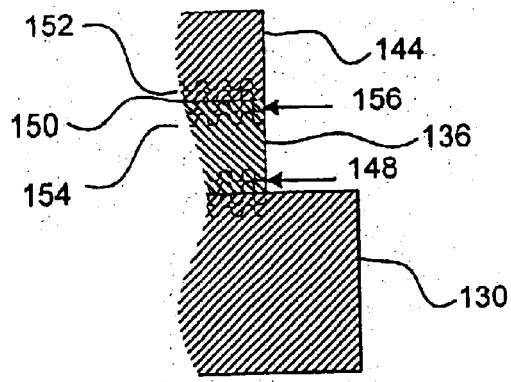

FIG. 8C illustrates the formation of second interface region 150 between a second oxide layer 144 and the first epitaxial layer 136, including a boron depleted region 154 and a boron enriched region 152, formed by the segregating of boron from first epitaxial layer 136 to second, oxide layer 144. Arrow 156 indicates the physical location that will correspond to the etch stop position on the surface of first epitaxial layer 136 near interface 150.

Figure 8D:
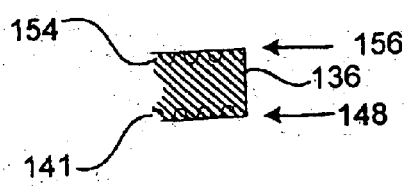

FIG. 8D illustrates first boron-doped epitaxial layer 136 after etching, resulting in the loss of silicon wafer 130 and second oxide layer 144. Etching also results in the partial loss of the first epitaxial layer up to the etch stop positions, indicated by arrows 148 and 156. As can be seen in FIG. 8D, first epitaxial layer 136 has a boron tail on both surfaces, at 141 and 156. The boron tail regions preferably have similar boron concentrations and similar contributions to the stress gradient applied to each surface, tending to counterbalance the effect of the opposing stress profile. In some embodiments, the resulting boron concentration in the final boron-doped epitaxial layer is similar to that illustrated in FIG. 5.

Referring now to FIGS. 9A through 9D, yet another method for reducing out-of-plane curvature in a boron-doped silicon epitaxial layer is illustrated. The method includes dry etching both surfaces of the boron-doped silicon epitaxial layer, including the surface having the boron tail and the surface not having the tail. The method illustrated in FIGS. 6A through 6C can be somewhat similar to the method illustrated in FIGS. 9A through 9C. In one embodiment, the wafer is first etched in EDP up to the etch stop level, then rinsed and dried. The wafer is then placed in a dry etch (such as a Reactive Ion Etch), and up to about 1 micron of silicon is removed from the entire structure.

Figure 9A:
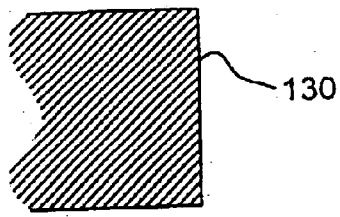
FIGS. 9A–9D are schematic representations of a method for creating a boron-doped silicon epitaxial layer having a reduced or eliminated boron tail, the method including dry etching both sides of the boron-doped silicon epitaxial layer, including the side having the boron tail.
Figure 9B:
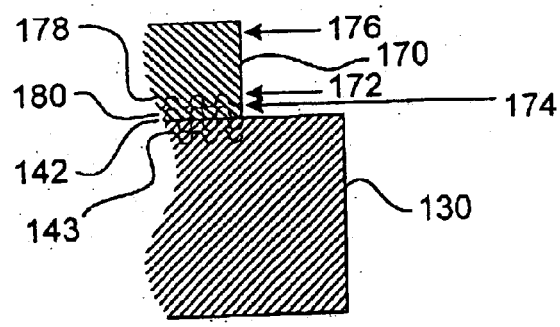

FIG. 9A illustrates silicon substrate layer 130, and FIG. 9B illustrates the silicon substrate layer after the growth of epitaxial layer 170, defining interface 142 therebetween. A boron depleted tail region may be seen near interface 142 including an inner tail region 178 and an outer tail region 180, where inner tail region 178 has a boron concentration less than the bulk of the epitaxial layer, but greater than the outer tail region 180. The boron has diffused into the boron enriched region 143 in silicon substrate layer 130, as previously described. The final dimensions of epitaxial layer 170 are indicated by arrows. The limit of the first etch is indicated at 174, the limit of the second etch is indicated at 172, and the final dimension of the air side surface of the epitaxial layer is indicated at 176.

Figure 9C:
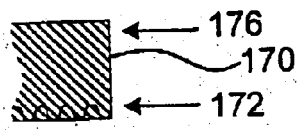

FIG. 9C illustrates the result of a first etching step using a boron selective etchant. This first etching step can be carried out under normal conditions in one embodiment. The first etching step results in etching away of the silicon substrate and the epitaxial layer up to the first etch stop point where the boron concentration increases to a level where the rate of etching significantly slows, often one or two orders of magnitude below the rate at the outer surface. The first etching step etches away epitaxial layer 170 to the point indicated at 174, partially through the boron tail. As can be seen from inspection of FIG. 9C, the final dimension indicated at 176 is disposed below the air side surface of epitaxial layer 170.

Figure 9D:
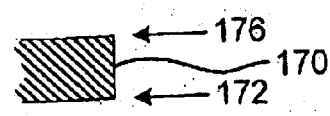

FIG. 9D illustrates the results of a dry etch to remove more or all of boron tail region 172. The dry etch may be non-boron selective, such as a Reactive Ion Etch. Thus, the dry etch step can be used to remove material from both the top and bottom surfaces of the epitaxial layer. As indicated by FIG. 9D, boron tail 172 is significantly or totally removed.

Figure 10:
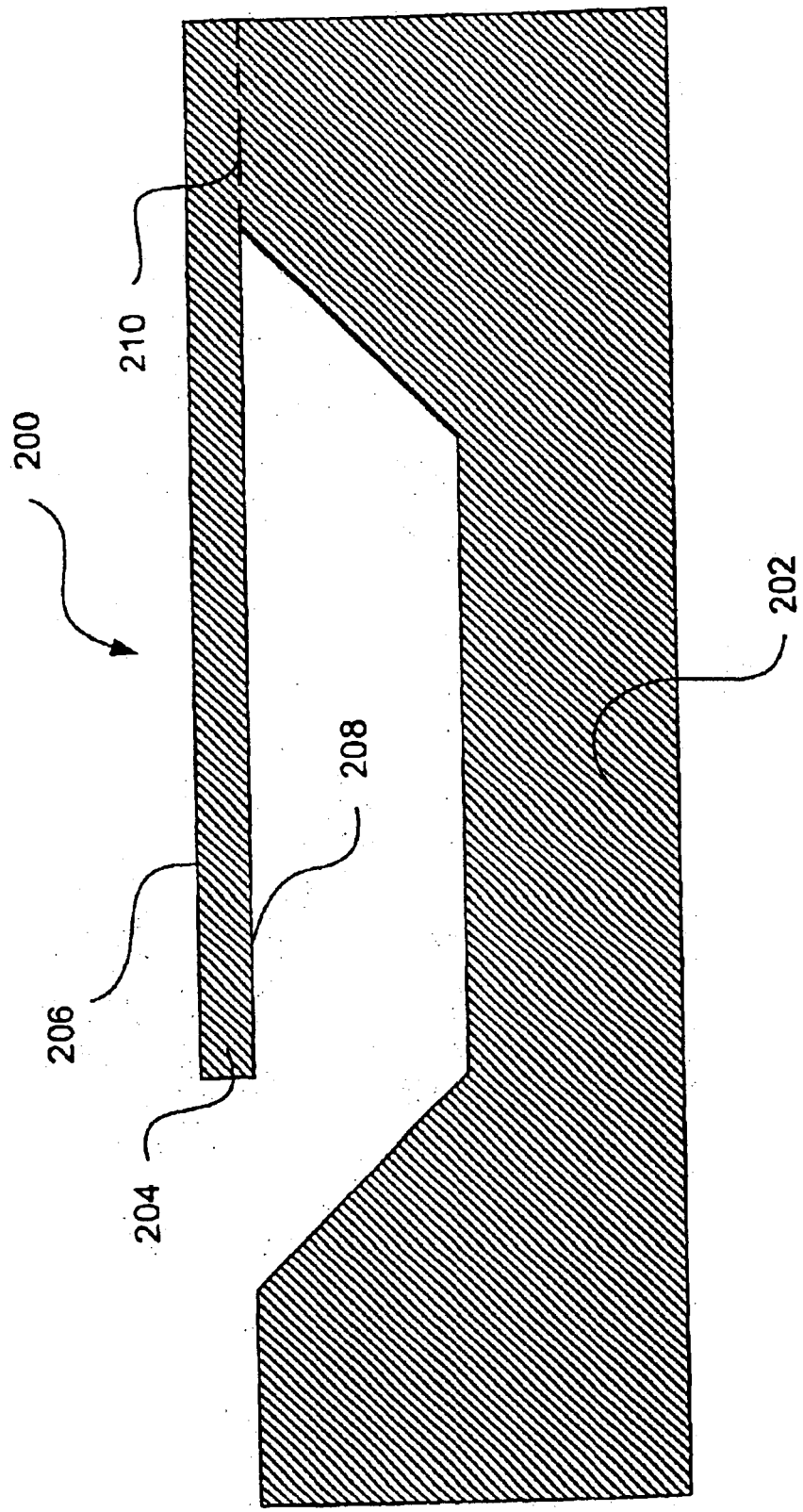
FIG. 10 is a schematic transverse cross-sectional view of a micro structure having a non-curved planar cantilever formed from a boron-doped silicon epitaxial layer.

Referring now to FIG. 10, a microstructure device 200 is shown. Microstructure 200 represents a microstructure device, such as a MEMS device, incorporating a body 202 and a cantilevered beam 204 having a top surface 206 and a bottom surface 208. In one embodiment, microstructure 200 forms part of an accelerometer. Cantilevered beam 204 is formed separately and later affixed to body 202 along a seam or interface 210. Alternatively, beam 204 may be integrally formed with body 202.

Beam 204 is preferably flat, having very little out-of-plane curvature. Accelerometers and other microdevices can benefit from planar structures having very flat surfaces and/or require ends that are centered relative to another part of the device. The present invention can be used to provide such components with very little out-of-plane curvature, thereby improving the performance of such microdevices.

Figure 11A:
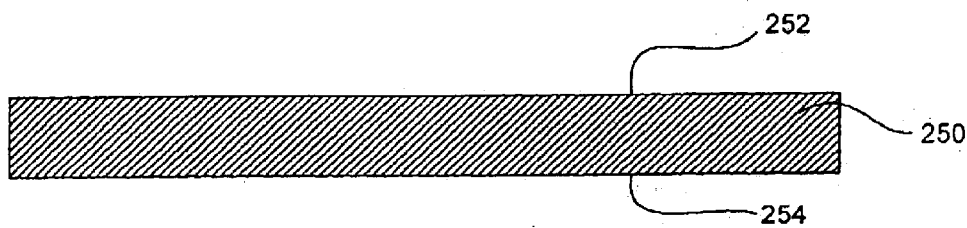
FIGS. 11A–11E are schematic representations of a method for creating a substantially planar wafer with low defect densities in the top surface of a highly boron-doped top layer.
Figure 11B:
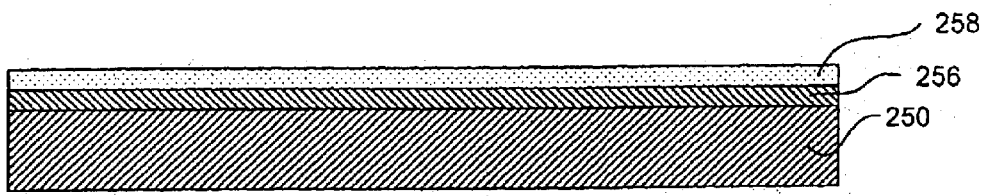
Figure 11C:
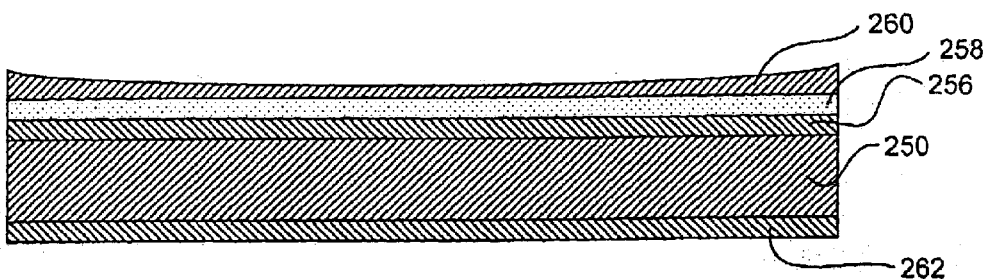

FIGS. 11A–11E are schematic representations of a method for creating a substantially planar wafer with low defect densities in the top surface of a highly boron-doped top layer. Beginning with FIG. 11A, a silicon wafer 250 is provided as a substrate. Silicon wafer 250 has a first surface 252 and a second surface 254. A to first epitaxial layer 256 of boron-doped silicon is grown on the first surface 252 of the silicon wafer 250, followed by a second non-doped (or lightly doped) epitaxial layer 258, as illustrated in FIG. 11B. Because of the increased tensile stress caused by the boron-doped epitaxial layer 256, the silicon wafer 250 may begin to cup out-of plane.

Figure 11D:
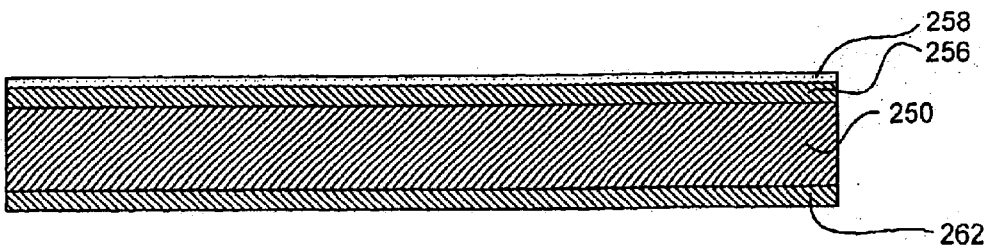
Figure 11E:
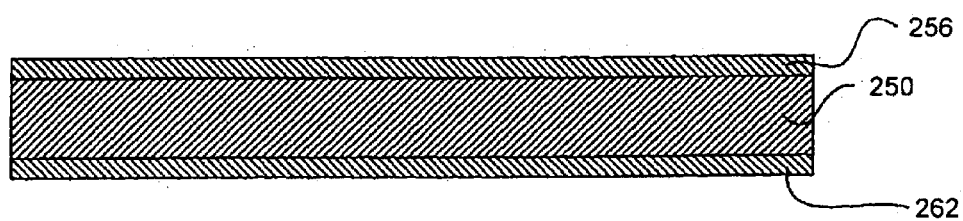

To reduce the out-of-plane curvature of the wafer 250, another heavily doped epitaxial layer is grown on the bottom surface of the wafer. In some cases, the growth of the boron-doped epitaxial silicon layers on the bottom side of the wafer results in the parasitic deposition of a thin layer of boron-doped silicon, layer on the top side of the silicon wafer as well, as shown at 260 and 262 in FIG. 11C. Then a dry etch (non-boron selective etch) is used to remove the heavily doped epitaxial layer 260 on the top surface of the structure, and possibly part of the non-doped (or lightly doped) epitaxial layer 258, as shown in FIG. 11D. Finally, a boron selective etch (EDP) is then used to remove the remaining portion of the non-doped (or lightly doped) layer 258 of FIG. 11D, as shown in FIG. 11E. The resulting structure includes heavily boron-doped layer 256 and 262 on both the top and bottom surfaces of the wafer, which may reduce the out-of-plane curvature of the wafer 250. It has also been found that the top surface of the top heavily boron-doped layer 256 may have very few defects with little contamination, thereby providing an ideal layer for forming the desired micromachined structures such as beams, slabs, combs, and fingers.

In all of the above embodiments, it is contemplated that the first highly doped epitaxial layer may be replaced by directly doping the top surface of a silicon wafer. That is, boron may be provided directly into the top surface of the silicon wafer by diffusion, ion implantation, or any other suitable method to produce a highly boron-doped layer. The remaining steps may remain substantially unchanged.

Numerous advantages of the invention covered by this document have been set forth in the foregoing description. It will be understood, however, that this disclosure is, in many respects, only illustrative. Changes may be made in details, particularly in matters of shape, dimension, and arrangement of parts without exceeding the scope of the invention. The invention's scope is, of course, defined in the language in which the appended claims are expressed.

What is claimed is:

1. A method for forming a substantially planar boron-doped silicon layer having first and second opposing surfaces, comprising:
    providing said boron-doped silicon layer; and
    causing substantially equal concentrations of boron at said first and second opposing surfaces.

2. A method according to claim 1, wherein said boron-doped silicon layer has a bulk boron concentration, and said concentrations of boron at said first and second opposing surfaces are substantially equal to the bulk boron concentration.

3. A method according to claim 1, wherein said boron-doped silicon layer has a bulk boron concentration, and said concentrations of boron at said first and second opposing surfaces are substantially less than the bulk boron concentration.

4. A method according to claim 2, wherein said boron-doped silicon layer initially has a boron-tail at the first opposing surface, and the causing step includes removing a portion of the boron-doped silicon layer inward from the first opposing surface to remove a portion of the boron-tail.

5. A method according to claim 4, wherein the portion of the boron-doped silicon layer is removed inward from the first opposing surface using a chemical etch.

6. A method according to claim 5, wherein said causing step includes growing an epitaxial layer adjacent to the second opposing surface of the boron-doped silicon layer to produce a boron-tail in the boron-doped silicon layer adjacent to the second opposing surface, and removing said epitaxial layer and a portion of the boron-doped silicon layer inward from the second opposing surface to remove a portion of the corresponding boron-tail.

7. A method according to claim 6, wherein said epitaxial layer and the portion of the boron-doped silicon layer are removed inward from the second opposing surface using a chemical etch.

8. A method according to claim 4, wherein the portion of the boron-doped silicon layer is removed inward from the first opposing surface using a dry-type etch.

9. A method for providing a substantially planar boron-doped silicon layer having first and second opposing surfaces, comprising:
    providing a silicon substrate having a top surface;
    providing the boron-doped silicon layer on the silicon substrate, the first opposing surface of the boron-doped silicon layer being adjacent the top surface of the silicon substrate;
    forming a boron receiving layer adjacent the second opposing surface of the boron-doped silicon layer;
    allowing some of the boron near the first opposing surface of the boron-doped silicon layer to diffuse into the top surface of the silicon substrate, and further allowing some of the boron near the second opposing surface of the boron-doped silicon layer to diffuse into the boron receiving layer; and
    etching away said silicon substrate and the boron receiving layer using a first etchant.

10. A method according to claim 9, wherein said etching step etches away at least part of said first and second opposing surfaces of the boron-doped silicon layer.

11. A method according to claim 9, wherein the boron receiving layer has a boron concentration substantially less than the bulk boron concentration in the boron-doped silicon layer.

12. A method according to claim 9, wherein said boron receiving layer is silicon based.

13. A method according to claim 9, wherein said boron receiving layer is oxide based.

14. A method according to claim 9, further comprising etching inward from the first and second opposing surfaces of the boron-doped silicon layer using a second etchant.

15. A method according to claim 14, wherein the second etchant is the same as the first etchant.

16. A method according to claim 14, wherein the second etchant is less boron selective than the first etchant.

17. A method for making a boron-doped silicon layer comprising:
    providing a silicon substrate layer;
    growing a first boron-doped silicon epitaxial layer on said silicon substrate layer having a first boron concentration over a first time period, the first boron-doped silicon epitaxial layer having two opposing surfaces;
    growing a second epitaxial layer on said first boron-doped silicon epitaxial layer having a second boron concentration less than said first boron concentration over a second time period at a second temperature;
    allowing boron in said first boron-doped epitaxial layer to diffuse into said silicon substrate and said second epitaxial layer to form boron tails adjacent the two opposing surfaces of the first boron-doped silicon epitaxial layer; and
    etching said silicon substrate and the second epitaxial layer using a first etchant.

18. A method according to claim 17, wherein said second epitaxial layer is silicon based.

19. A method according to claim 17, further comprising etching inward from the first and second opposing surfaces of the boron-doped silicon layer using a second etchant.

20. A method according to claim 17, wherein said boron-doped silicon layer is selected such that the segregation coefficient of boron-doped silicon layer in higher than in silicon.

21. A method according to claim 18, further comprising maintaining said silicon substrate at about said second temperature for about said second period of time after growing said second epitaxial layer;

22. A method for making a boron-doped silicon layer comprising:
    providing a silicon substrate layer;
    growing a boron-doped silicon epitaxial layer on said silicon substrate layer having a first boron concentration over a first time period;
    allowing boron in said first boron-doped epitaxial layer to diffuse into said silicon substrate resulting in a boron-tall adjacent the silicon substrate;
    etching said silicon substrate using a first etchant for a first period of time, such that said silicon substrate and at least part of said boron-tail in the boron-doped silicon epitaxial layer are removed at a first etch rate;

etching said boron-doped silicon epitaxial layer in a second etchant for a second period of time, such that more of said silicon epitaxial layer is removed at a second etch rate.

23. A method according to claim 22, wherein said second etchant is different than said first etchant.

24. A method according to claim 22, wherein said first etchant is the same as said second etchant and said second rate is less than said first rate.

25. A method according to claim 23, wherein said second etchant is less boron selective than said first etchant.

26. A method for making a boron-doped silicon layer comprising:

providing a silicon substrate layer;

growing a first boron-doped silicon epitaxial layer on said silicon substrate layer having a first boron concentration over a first time period;

allowing boron in said first boron-doped epitaxial layer to diffuse into said silicon substrate, such that a boron-tail is formed in said first boron-doped epitaxial layer having a concentration of boron that is less than said first boron concentration;

etching said silicon substrate in EDP, KOH, hydrazine or TMAH, such that said silicon substrate and at least part of said boron-tail is removed; and dry etching said boron-doped silicon layer, such that said boron-tail is even further removed.

27. A method for making a relatively planar wafer having a boron-doped silicon layer, comprising:

providing a silicon substrate having a top surface and a bottom surface;

causing the boron-doped silicon layer to be provided on the top surface of the wafer, the boron-doped silicon layer having a first boron concentration;

growing a second epitaxial layer on the boron-doped silicon layer, the second epitaxial layer having no boron concentration or a boron concentration that is less than the first boron concentration;

growing a parasitic third epitaxial layer on the second epitaxial layer, the parasitic third epitaxial layer having a boron concentration that is higher than the boron concentration of the second epitaxial layer;

growing a fourth epitaxial layer on the bottom surface of the wafer, the fourth epitaxial layer having a boron concentration that is substantially equal to the boron concentration of the second epitaxial layer, removing the parasitic third epitaxial layer disposed on the top side of the wafer using a dry etch; and removing the second epitaxial layer.

28. A method according to claim 27, wherein dry etch removes part of the second epitaxial layer.

29. A method according to claim 27, wherein the second epitaxial layer is removed using a boron selective etch.

30. A method according to claim 29, wherein the boron selective etch is EDP, KOH, hydrazine or TMAH.

* * * * *